US012425056B2

(12) United States Patent
Tam et al.

(10) Patent No.: US 12,425,056 B2
(45) Date of Patent: Sep. 23, 2025

(54) CANCELLATION CIRCUIT USING DIGITAL TO TIME CONVERTER

(71) Applicant: NXP USA, Inc., Austin, TX (US)

(72) Inventors: Sai-wang Tam, Sunnyvale, CA (US); Tian Liu, Los Angeles, CA (US); Alireza Razzaghi, Mountain View, CA (US); Alden C Wong, Sunnyvale, CA (US); Ovidiu Carnu, Scotts Valley, CA (US); Wai Lau, San Jose, CA (US); Sridhar Reddy Narravula, Cupertino, CA (US); Yui Lin, Palo Alto, CA (US); Sudhir Srinivasa, Los Gatos, CA (US)

(73) Assignee: NXP USA, Inc., Austin, TX (US)

( * ) Notice: Subject to any disclaimer, the term of this patent is extended or adjusted under 35 U.S.C. 154(b) by 362 days.

(21) Appl. No.: 18/296,759

(22) Filed: Apr. 6, 2023

(65) Prior Publication Data
US 2024/0340031 A1    Oct. 10, 2024

(51) Int. Cl.
*H04B 1/04* (2006.01)
*G04F 10/00* (2006.01)
*H03M 1/10* (2006.01)

(52) U.S. Cl.
CPC ......... *H04B 1/0475* (2013.01); *G04F 10/005* (2013.01); *H03M 1/1014* (2013.01); *H04B 2001/0408* (2013.01)

(58) Field of Classification Search
CPC .......... H04B 1/0475; H04B 2001/0408; H04B 1/123; H04B 1/1027; H04B 15/02; H04B 2215/00; G04F 10/005; H03M 1/1014
USPC ....................................................... 455/114.2
See application file for complete search history.

(56) References Cited

U.S. PATENT DOCUMENTS

| 11,374,615 | B1 | 6/2022 | Tam et al. | |
| 11,901,932 | B2* | 2/2024 | Avraham | H04B 1/525 |
| 2009/0167578 | A1* | 7/2009 | Takahashi | H03M 1/1033 |
| | | | | 341/120 |
| 2016/0099733 | A1 | 4/2016 | Weissman et al. | |
| 2017/0310508 | A1 | 10/2017 | Moorti et al. | |

(Continued)

OTHER PUBLICATIONS

A. Raghavan, E. Gebara, E. M. Tentzeris and J. Laskar, "Analysis and design of an interference canceller for collocated radios," in IEEE Transactions on Microwave Theory and Techniques, vol. 53, No. 11, pp. 3498-3508, Nov. 2005.

(Continued)

*Primary Examiner* — Don N Vo

(57) ABSTRACT

A cancellation circuit includes a limiter connected to an output of a first transmitter power amplifier that converts in input sinewave to a digital square wave and a digital to time converter (DTC) connected to the limiter. A RF digital to RF converter is connected to the DTC that converts the digital square wave input into an analog RF output. A cancellation amplifier with an input receives an output from the RF digital to RF converter and has an output connected to an output of a second transmitter power amplifier. The cancellation amplifier produces a cancellation signal to cancel an interference signal at the output of the second transmitter power amplifier from the output of the first transmitter power amplifier. A power detector is connected to the output of the second power amplifier that produces a power value detected at the output of the second power amplifier.

20 Claims, 6 Drawing Sheets

(56) References Cited

U.S. PATENT DOCUMENTS

2023/0013907 A1* 1/2023 Mukherjee ............ G04F 10/005
2023/0403016 A1* 12/2023 Parsa ...................... H03L 7/093
2024/0223201 A1* 7/2024 Perrott ................ H03M 1/1033

OTHER PUBLICATIONS

A. Katz, D. McGee, C. Brinton and J. Qiu, "Sensitivity and mitigation of Reverse IMD in power amplifiers," 2011 IEEE Topical Conference on Power Amplifiers for Wireless and Radio Applications, Phoenix, AZ, 2011, pp. 53-56.
S. Ahmed and M. Faulkner, "Mitigation of Reverse Intermodulation Products at Colocated Base Stations," in IEEE Transactions on Circuits and Systems I: Regular Papers, vol. 60, No. 6, pp. 1608-1620, Jun. 2013.
T. Zhang, C. Su, A. Najafi, and J. C. Rudell, "Wideband Dual-Injection Path Self-Interference Cancellation Architecture for Full-Duplex Transceivers," in IEEE Journal of Solid-State Circuits, vol. 53, No. 6, pp. 1563-1576, Jun. 2018.

* cited by examiner

CANCELLATION CIRCUIT USING DIGITAL TO TIME CONVERTER

FIELD OF THE DISCLOSURE

Various exemplary embodiments disclosed herein relate to on-chip fully digital cancellation circuits using digital to time converter (DTC) for both third-order intermodulation distortion (IMD3) (TX to TX) and self-interference (TX to RX) cancellation.

BACKGROUND

Two-tone third-order intermodulation distortion (IMD3) is the measure of the third-order distortion products produced by a nonlinear device when two tones closely spaced in frequency are fed into its input. This distortion product is usually so close to the carrier that it is almost impossible to filter out and can cause interference in multichannel communications equipment Radios may also have receiver interference were a transmit signal from one radio is injected into the receiver of an adjacent radio causing interference.

SUMMARY

A summary of various exemplary embodiments is presented below.

Various embodiments relate to a cancellation circuit, including: a limiter connected to an output of a first transmitter power amplifier, wherein the limiter is configured to convert in input sinewave to a digital square wave; a digital to time converter (DTC) connected to the limiter, wherein the DTC is configured to receive a DTC control value to delay a signal received by the DTC; a RF digital to RF converter connected to the DTC, wherein the RF digital to RF converter is configured to convert the digital square wave input into an analog RF output, wherein the RF digital to RF converter is configured to receive a RF Digital to RF control value to control a gain of the RF digital to RF converter; a cancellation amplifier with an input configured to receive an output from the RF digital to RF converter and an output connected to an output of a second transmitter power amplifier, wherein the cancellation amplifier produces a cancellation signal to cancel an interference signal at the output of the second transmitter power amplifier from the output of the first transmitter power amplifier; and a power detector connected to the output of the second power amplifier, the power detector configured to produce a power value detected at the output of the second power amplifier.

Various embodiments are described, further including a controller configured to calibrate the cancellation circuit.

Various embodiments are described, wherein calibrating the cancellation circuit further includes: putting the first transmitter power amplifier in an idle mode; putting the second transmitter power amplifier in an idle mode; commanding the first transmitter power amplifier to produce a continuous wave tone having a frequency of a first frequency channel of the first transmitter power amplifier; varying the DTC control value and determining a DTC calibration value that produces lowest power value at the power detector; applying the DTC calibration value to the DTC; and varying the RF digital to RF control value and determining an RF digital to RF calibration value that produces the lowest power value at the power detector.

Various embodiments are described, wherein calibrating the cancellation circuit further includes varying the DTC control value and determining a DTC calibration value that produces lowest power value at the power detector includes using a first binary search method, and varying the RF digital to RF control value and determining an RF digital to RF calibration value that produces the lowest power value at the power detector includes using a second binary search method.

Various embodiments are described, further including setting a coarse amplitude of the RF digital to RF converter based upon an antenna isolation parameter.

Various embodiments are described, wherein calibrating the cancellation circuit further includes: repeating for a second to a total number of frequency channels of the first transmit power amplifier to produce DTC calibration values and RF digital to RF calibration values for each of the frequency channels of the first transmit power amplifier: selecting one of a second to the total number of frequency channels of the first transmit power amplifier; commanding the first transmitter power amplifier to produce a continuous wave tone having the frequency associated with the selected frequency channel; varying the DTC control value and determining a DTC calibration value that produces lowest power value at the power detector; applying the DTC calibration value to the DTC; and varying the RF digital to RF control value and determining an RF digital to RF calibration value that produces the lowest power value at the power detector.

Various embodiments are described, wherein the controller is configured to: monitor the power value at the power detector; adjust a DTC calibration value based upon a variation in the power value at the power detector; and adjust a RF to digital RF calibration value based upon a variation in the power value at the power detector.

Various embodiments are described, wherein the cancellation amplifier is a scaled version of the second transmitter power amplifier.

Various embodiments are described, a transmit signal produced by the first transmitter power amplifier is a constant envelope signal.

Further various embodiments relate to a cancellation circuit, including: a limiter connected to an output of a first transmitter power amplifier, wherein the limiter is configured to convert in input sinewave to a digital square wave; a digital to time converter (DTC) connected to the limiter, wherein the DTC is configured to receive a DTC control value to delay a signal received by the DTC; a RF digital to RF converter connected to the DTC, wherein the RF digital to RF converter is configured to convert the digital square wave input into an analog output, wherein the RF digital to RF converter is configured to receive a RF Digital to RF control value to control a gain of the RF digital to RF converter; a cancellation amplifier with an input configured to receive an output from the RF digital to RF converter and an output connected to an output of a second transmitter power amplifier, wherein the cancellation amplifier produces a cancellation signal to cancel an interference signal at the output of the second transmitter power amplifier from the output of the first transmitter power amplifier; a receiver including: a low noise amplifier (LNA) attached to a first side of a transformer, wherein the transformer has a second side connected to the output of the second power amplifier; a baseband mixer connected to the LNA; and an analog-to-digital converter (ADC) connected to the baseband mixer; and a digital filter connected to the output of ADC, the digital filter configured to produce a power value detected at the first side of the transformer.

Various embodiments are described, further including a controller configured to calibrate the cancellation circuit.

Various embodiments are described, wherein calibrating the cancellation circuit further includes: putting the first transmitter power amplifier in a continuous wave (CW) mode; putting the second transmitter power amplifier in an off mode; putting the receiver in an on mode; commanding the first transmitter power amplifier to produce a continuous wave tone having a frequency of a first frequency channel of the first transmitter power amplifier; varying the DTC control value and determining a DTC calibration value that produces lowest power value at the digital filter; applying the DTC calibration value to the DTC; and varying the RF digital to RF control value and determining an RF digital to RF calibration value that produces the lowest power value at the digital filter.

Various embodiments are described, wherein calibrating the cancellation circuit further includes varying the DTC control value and determining a DTC calibration value that produces lowest power value at the digital filter includes using a first binary search method, and varying the RF digital to RF control value and determining an RF digital to RF calibration value that produces the lowest power value at the digital filter includes using a second binary search method.

Various embodiments are described, further including setting a coarse amplitude of the RF digital to RF converter based upon an antenna isolation parameter.

Various embodiments are described, wherein calibrating the cancellation circuit further includes: repeating for a second to a total number of frequency channels of the first transmit power amplifier to produce DTC calibration values and RF digital to RF calibration values for each of the frequency channels of the first transmit power amplifier: selecting one of a second to the total number of frequency channels of the first transmit power amplifier; commanding the first transmitter power amplifier to produce a continuous wave tone having the frequency associated with the selected frequency channel; varying the DTC control value and determining a DTC calibration value that produces lowest power value at the digital filter; applying the DTC calibration value to the DTC; and varying the RF digital to RF control value and determining an RF digital to RF calibration value that produces the lowest power value at the digital filter.

Various embodiments are described, wherein the controller is configured to: monitor the power value at the digital filter; adjust DTC calibration value based upon a variation in the power value at the digital filter; and adjust a RF to digital RF calibration value based upon a variation in the power value at the digital filter.

Various embodiments are described, wherein the cancellation amplifier is a scaled version of the second transmitter power amplifier.

Various embodiments are described, a transmit signal produced by the first transmitter power amplifier is a constant envelope signal.

Further various embodiments relate to a cancellation circuit for a multiple-input multiple-output system, including: a first limiter connected to an output of a first transmitter power amplifier, wherein the limiter is configured to convert in input sinewave to a digital square wave; a first digital to time converter (DTC) connected to the limiter, wherein the first DTC is configured to receive a first DTC control value to delay a signal received by the first DTC; a first RF digital to RF converter connected to the DTC, wherein the first RF digital to RF converter is configured to convert the digital square wave input into an analog output, wherein the first RF digital to RF converter is configured to receive a first RF Digital to RF control value to control a gain of the first RF digital to RF converter; a second limiter connected to an output of a second transmitter power amplifier; a second digital to time converter (DTC) connected to the limiter, wherein the second DTC is configured to receive a second DTC control value to delay a signal received by the second DTC; a second RF digital to RF converter connected to the DTC, wherein the second RF digital to RF converter is configured to convert the digital square wave input into an analog output, wherein the second RF digital to RF converter is configured to receive a second RF Digital to RF control value to control a gain of the second RF digital to RF converter; a cancellation amplifier with an input configured to receive an output from the first RF digital to RF converter and the second RF digital to RF converter and an output connected to an output of a third transmitter power amplifier, wherein the cancellation amplifier is configured to produce a cancellation signal to cancel an interference signal at the output of the third transmitter power amplifier from the output of the first transmitter power amplifier and the output of the second transmitter power amplifier; and a power detector connected to the output of the third power amplifier, the power detector configured to produce a power value detected at the output of the third power amplifier.

Various embodiments are described, further including a controller configured to calibrate the cancellation circuit.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
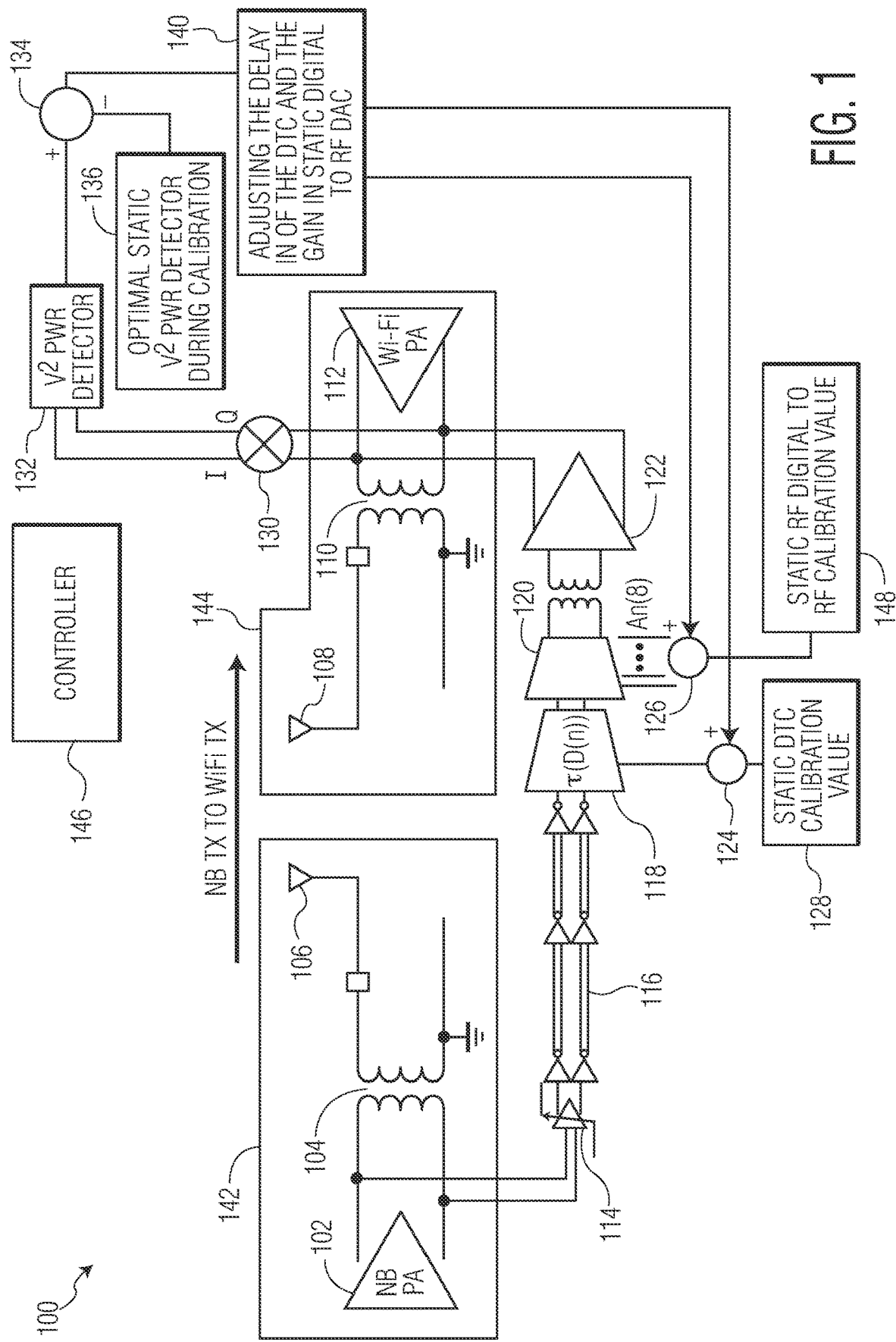
FIG. 1 illustrates an RF system with an IMD3 cancellation circuit.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of a cancellation circuits and systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

The number of radios at different frequency bands present in various communication systems increasing. This may lead to third-order intermodulation distortion (IMD3) (transmit (TX) to TX). Also, individual radios may have receiver interference (TX to receive (RX)). Filtering this interference is often not practical, accordingly, on-chip IMD3 and receiver interference cancellation circuits for concurrent transceivers are described in this disclosure. Using this cancellation technique, the cross-coupling aggressor tones between two simultaneous transmitting power amplifiers or transmitter and receiver will be effectively cancelled out by these circuits. Subsequently, the corresponding limitation of the IMD3 at transmitter or the interference at the receiver will be eliminated. This proposed architecture not only enables the possibility of the high-power concurrent transceiver without violating the spectrum mask due to the IMD3 from the cross coupling between multiple transmitters, but it also enables the use of frequency-division duplexing (FDD) on systems with multiple radios.

Cancelling interference in full duplex and concurrent transmission systems will be described herein. In a full duplex system, the receiver is receiving a signal with the transmitter is transmitting. This leads to interference when the transmit signal is coupled into the receiver. In this situation the aggressor is the transmitter and the victim is the receiver such that the aggressor TX desensitizes the victim RX. In a concurrent transmission system, two different transmitters in the system are transmitting at the same time. Mutual coupling between the two transmitters will create unwanted IMD3 due to non-linearities in the power amplifiers of the transmitters. As a result there are two aggressors and two victims.

Transmitter aggressor fully digital cancellation circuits for both transmitter to transmitter and transmitter to receiver cancellation will now be described. The cancellation circuits will work on narrow-band (NB) TX aggressor cancellation. For example, the signals may have a narrow bandwidth of ~1 MHz and may be a constant envelope signal with frequency and phase modulation only. Cancellation circuits will be described for both cases i.e., TX to TX (IMD3 cancellation) and TX to RX (receiver cancellation). This will be accomplished using digital-to-time converters (DTC) that do not need long delay lines. Further, the cancellation circuits may implement continuous wave (CW) tone approximation and use a fully digital phase shifter. The cancellation circuits seek to generate a cancellation signal that will have the same amplitude as the interference signal with a 180° phase difference. Hence, this will cancel out the interference signal.

FIG. 1 illustrates an RF system with an IMD3 cancellation circuit. The RF system 100 includes a NB transmitter 142 and a Wi-Fi transmitter 144. The NB transmitter 142 may be a Bluetooth transmitter or any other constant envelope NB transmitter. The Wi-Fi transmitter 144 may be other types of wide-band transmitters. In some descriptions these may be a first transmitter and a second transmitter. In this example, the NB transmitter 142 is the aggressor transmitter, i.e., because of coupling between a Wi-Fi antenna 106 and a Wi-Fi antenna 108. The transmit signal from the NB transmitter 142 is coupled into the Wi-Fi transmitter 144. It is noted that in this situation, both of the transmitters may both be the aggressor and victim at the same time. In FIG. 1 though, the NB transmitter 142 will be the aggressor and Wi-Fi transmitter 144 the victim.

The NB transmitter 142 includes a NB power amplifier 102 connected to the Wi-Fi antenna 106 via a NB transformer 104. The Wi-Fi transmitter 144 includes a Wi-Fi power amplifier 112 connected to the Wi-Fi antenna 108 via a receive transformer 110.

The various elements of the cancellation circuit will now be described. A limiter 114 is connected to the output of the NB power amplifier 102. The limiter 114 is a digital limiter that converts the NB power amplifier 102 output RF signal to a digital signal that is like a square wave signal. Because the NB output signal uses only phase (or possibly frequency) modulation, the limiter 114 preserves the information in the NB output signal. This effectively becomes a digital signal that is much easier to route in the system to reduce interference with other elements of the circuits in the NB transmitter 142. Further, this signal remains coherent with the transmit signal so that any coupled aggressor tone may be effectively canceled.

Long digital repeater routing 116 connects the output of the limiter 114 to the input of the DTC 118. The DTC 118 delays the digital signal from the limiter 114 so that ultimately a cancellation signal is 180° out of phase with the aggressor signal present at the output of the Wi-Fi power amplifier 112. It is noted that the use of the DTC 118 may be much more accurate than the use of an analog RF IQ phase shifter with a poly-phase filter. Further, the DTC 118 is easier to calibrate because analog RF IQ calibration is not needed. The DTC 118 may have an 8-bit control inputs or DTC control values that would provide a phase resolution of 1.4°. It is noted that more or fewer bits may be used depending upon the cancellation requirements.

The delayed digital signal output by the DTC 118 is input into the RF digital to RF converter 120. The RF digital to RF converter 120 converts the input delayed digital signal back into an RF signal. In this example the RF digital to RF converter 120 may receive 8-bit control inputs or RF digital to RF control values that determine the amplitude of the RF signal output. It is noted that more or fewer bits may be used depending upon the cancellation requirements. The RF output of the RF digital to RF converter 120 may then be fed into a cancellation amplifier 122. The cancellation amplifier 122 is a scaled version (for example ⅛) of the Wi-Fi power amplifier 112. Typically the cancellation amplifier 122 and Wi-Fi power amplifier 112 would be manufactured at the same time using the same process because they are on the same chip, so they would have the same or similar characteristics that would vary over process, voltage, and temperature (PVT). The output of the cancellation amplifier 122 is coupled to the output of the Wi-Fi power amplifier 112. The cancellation signal produced by the cancellation amplifier 122 will have the same amplitude with a 1800 shift as compared to the aggressor tone that would be present in the Wi-Fi transmitter 144 and that would cause an IMD3 signal to be generated. This is done by controlling the control inputs into the DTC 118 and the amplitude adder 126 to produce the cancellation signal that cancels out the aggressor tone.

A mixer 130 samples the output of the Wi-Fi power amplifier 112 to produce in-phase (I) and quadrature (Q) signals that are fed into a power detector 132. A low pass filter may be used to filter the output of the mixer 130. The power detector 132 produces a power value indicative of the power in the output signal of the Wi-Fi power amplifier 112. The power detector 132 may be a voltage squared ($V^2$) detector. A controller 146 may control the overall operation of the system including the cancellation circuit, and the controller 146 may receive the power value output by the power detector 132. The power detector 132 may produce a digital output that is indicative of the measured power. The controller 146 may then produce a DTC calibration value 128 that controls the DTC 118 and the RF Digital to RF calibration value 148 that controls the RF digital to RF converter 120. Further, the controller 146 may carry out the calibration procedure that will be described below. The DTC calibration value 128 and RF Digital to RF calibration value 148 may be produced during the calibration procedure. This may be considered static values that are used to characterize the long term aspects of the system.

It is noted that the Wi-Fi antenna 106 to Wi-Fi antenna 108 coupling may vary over time. For example, with a mobile device such as a phone or a tablet, the presence of the user's hand or face near the antennas may cause a variation in the coupling. As a result, an additional compensation loop may be used to compensate for these sorts of variations. During operation of the RF system 100, the power detector 132 monitors the output power of the Wi-Fi power amplifier 112. A power adder 134 subtracts a power calibration value 136 from the output of the power detector 132. The output of the power adder 134 is input into a DTC and RF compensator 140 that determines if the variation in the output value is greater than some threshold value that would indicate that further calibration is needed. If so, then the DTC and RF compensator 140 uses the value output by the power adder 134 to further adjust the delay of the DTC 118 and the gain of the RF digital to RF converter 120. The DTC and RF compensator 140 output adjustment values that are fed into the delay adder 124 and the amplitude adder 126. The delay adder 124 adds the DTC adjustment value to the DTC calibration value 128, and the output of the delay adder 124 is input into the DTC 118. Likewise, the amplitude adder 126 adds the gain adjustment value to the RF Digital to RF calibration value 148, and the output of the amplitude adder 126 is input into the RF digital to RF converter 120. It is noted that the DTC and RF compensator 140 may be implemented in the controller 146.

Figure 2:
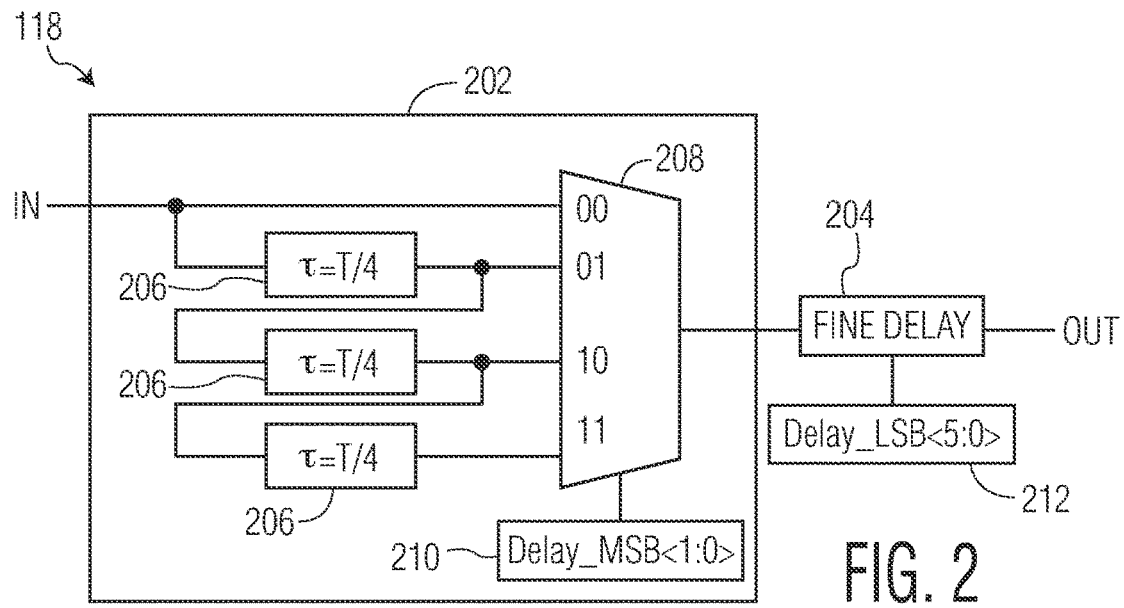
FIG. 2 illustrates an embodiment of the DTC.

FIG. 2 illustrates an embodiment of the DTC 118. The DTC 118 includes a coarse delay circuit 202 and a fine delay circuit 204. The coarse delay circuit 202 provides time delays corresponding to 0°, 90°, 180°, and 270° phase delay. This may be accomplished by using three coarse delay elements 206. Each coarse delay element 206 provides 90° of delay, i.e., $\tau=T/4$ where $\tau$ is the time delay and T is the period of the signal being delayed. The three coarse delay elements 206 are chained together, i.e., the output of the first coarse delay element 206 is input into the second coarse delay element 206, and the output of the second coarse delay element 206 is input into the input of the third coarse delay element 206. Further, the coarse delay circuit 202 includes a multiplexer 208 with four inputs. The first input is connected directly to an input of the coarse delay circuit 202. The other three inputs of the multiplexer 208 are connected to each of the three coarse delay elements 206. The multiplexer 208 receives a two bit coarse delay value 210 that is used to select which one of the inputs of multiplexer 208 to output. In this example the coarse delay value 210 includes 2 bits. It is noted that more or fewer control bits may be used. If so, then the number of coarse delay elements 206 and multiplexer inputs will be chosen accordingly. The output of the coarse delay circuit 202 is fed into the fine delay circuit 204. The fine delay circuit 204 provides a time delay corresponding to phase control over 90° of phase delay. The fine delay circuit 204 may be controlled by a fine delay value 212, which is 6-bits in this example, and the fine delay value 212 provides a phase resolution of 1.4°. If more or fewer bits are used to control the fine delay circuit 204, the phase resolution changes and architecture of the fine delay circuit 204 will change as well.

Figure 3:
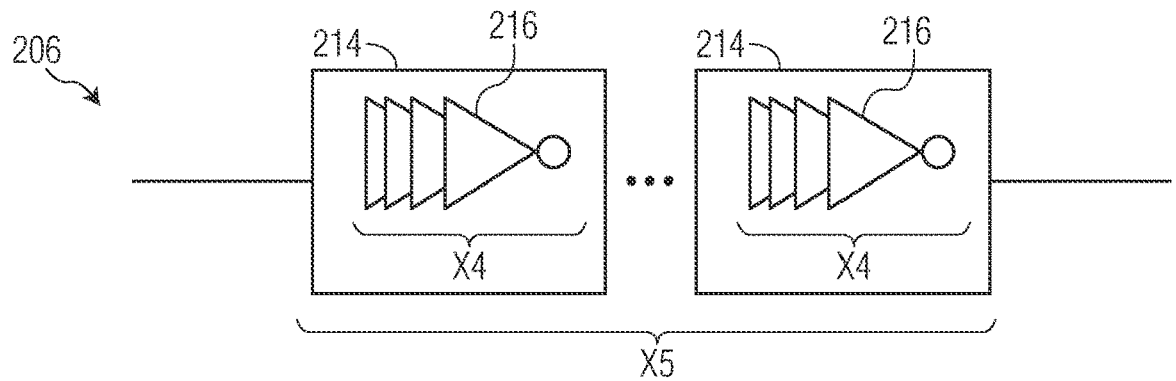
FIG. 3 illustrates an embodiment of the coarse delay element.

FIG. 3 illustrates an embodiment of the coarse delay element 206. The coarse delay element 206 may include 5 coarse delay sub-elements 214. The coarse delay sub-element 214 may include 4 delay invertors 216. The delay invertors 216 are designed to provide a time delay corresponding to a 90°/20 phase delay or T/80 time delay. Other numbers of coarse delay sub-elements 214 and delay invertors 216 may be chosen based upon various design considerations including area and power consumption.

Figure 4:
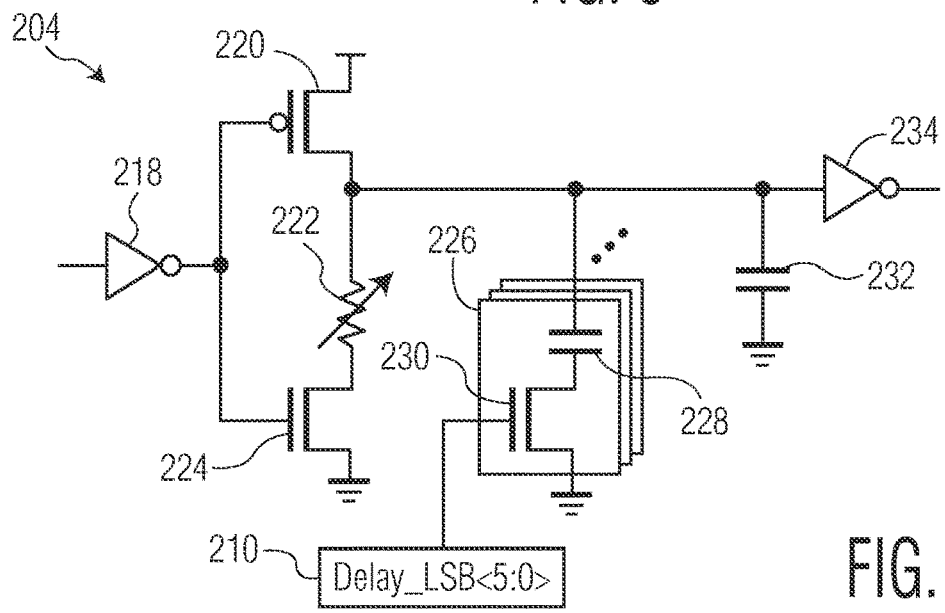
FIG. 4 illustrates and embodiment of the fine delay circuit.

FIG. 4 illustrates and embodiment of the fine delay circuit 204. The fine delay circuit 204 includes an input buffer 218 that receives the input signal that is then fed into a network of first transistor 220, second transistor 224, and variable resistor 222. The variable resistor 222 may be adjusted to tune the fine delay circuit 204 as needed. The variable resistor 222 is in parallel with a group of fine delay capacitors 228 and a capacitor 232 to form a circuit with a desired delay characteristic. The capacitor 232 is a fixed value. The fine delay circuit 204 includes a plurality of fine delay elements 226 that each include a fine delay capacitor 228 and fine delay transistor 230. The fine delay transistor 230 is turned on and off based upon a bit of the coarse delay value 210. Each of the fine delay capacitors 228 has a capacitance value that adds a certain amount of additional delay when it is added to the fine delay circuit 204. Accordingly, based upon the coarse delay value 210 various of the fine delay elements 226 will be activated to produce the commanded delay value.

The DTC 118 described above is but one potential implementation of the DTC 118. Other digital implementations may be used as well. Further, 8-bit control is illustrated, but that could be more or fewer bits. In other embodiments a different number of bits may be used for the coarse delay circuit 202 and the fine delay circuit 204. In yet other embodiments, the DTC 118 may be implemented using a single stage or more stages.

Figure 5:
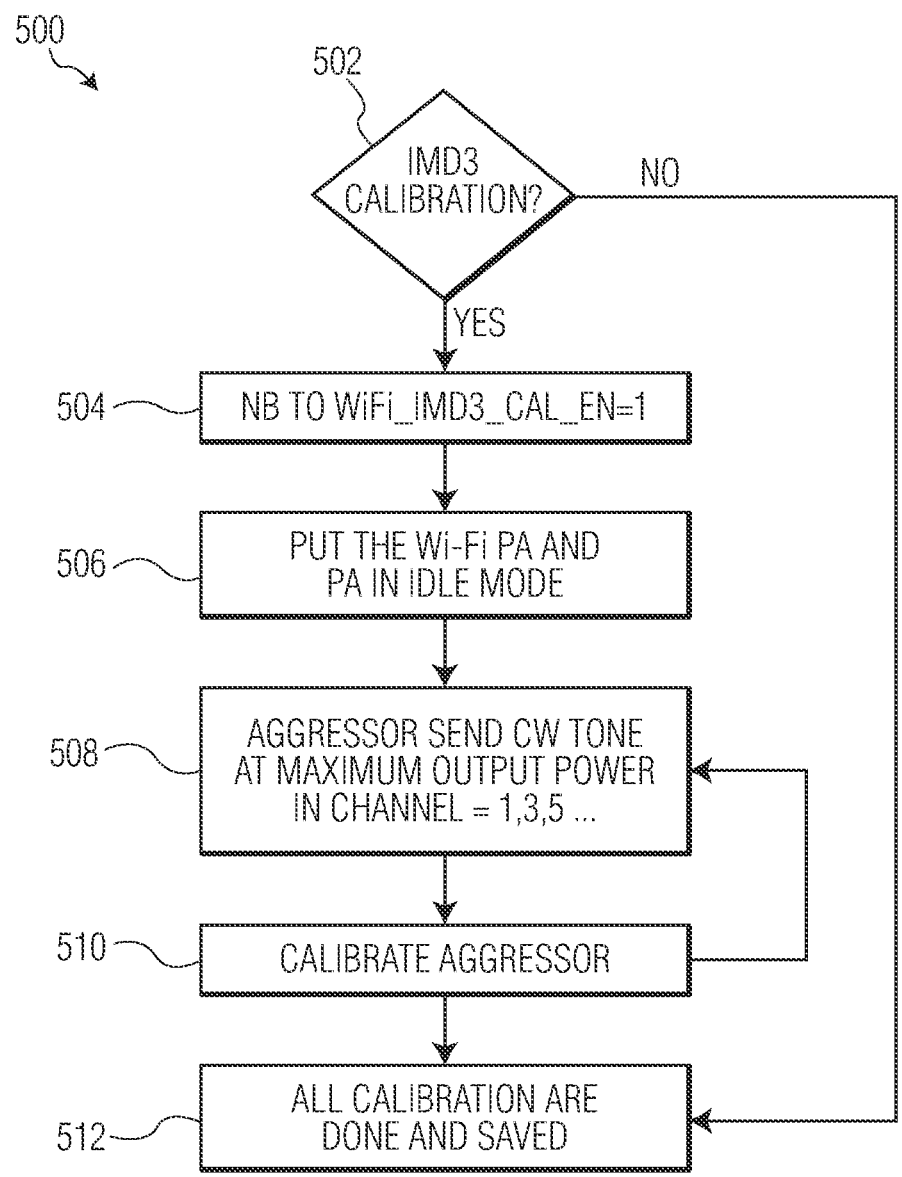
FIG. 5 illustrates a TX to TX calibration method.

FIG. 5 illustrates a TX to TX calibration method 500. The TX to TX calibration method 500 may be used to calibrate the RF system 100 illustrated in FIG. 1 to perform IMD3 cancellation. The TX to TX calibration method 500 may largely be carried out by the controller 146 controlling various elements of the RF system 100. The TX to TX calibration method 500 starts by determining if IMD3 calibration is needed in a TX to TX scenario 502. If not then the TX to TX calibration method 500 goes to step 512 and ends. If so, then the TX to TX calibration method 500 sets an NB to Wi-FI_IMD3_CAL_EN flag 504. The TX to TX calibration method 500 then puts the NB power amplifier 102 and the Wi-Fi power amplifier 112 in idle mode 506. Then the TX to TX calibration method 500 has the aggressor, in this case the NB transmitter 142, send out a CW tone at maximum power in a first channel 508. Then the TX to TX calibration method 500 calibrates the RF system 100 based upon the transmitted aggressor tone 510.

The steps of the calibration 508 will now be described. First, the TX to TX calibration method 500 sets a coarse amplitude based on antenna isolation. The antenna may have different potential isolation values controlled by a bit value. For example three different antenna isolation values of −25 dB, −20 dB, and −15 dB may be selected using a three bit input. Second, the TX to TX calibration method 500 determines the optimal phase setting for the DTC 118. This may be done by using a binary search of the delay control values. For example, the binary search may loop over each for the 4 different coarse delay values produced by the coarse delay circuit 202. Then a binary search is performed to determine the fine delay value that produces the lowest output of the power detector 132 for each of the coarse delay values. Once this has been done for each of the four coarse delay values, the fine delay value associated with the lowest power detector 132 output will be selected as the DTC calibration value 128. The binary search helps to shorten the time it takes to find the fine delay value with the lowest power detector 132 output. But other methods of searching the control values for the lowest power detector 132 output may be used as well, including simply cycling through all of the DTC 118 control values. Third, the TX to TX calibration method 500 determines the optimal magnitude value for the RF digital to RF converter 120. This may be done by using the previously determined DTC calibration value 128 and searching the magnitude values for the value that produces the lowest power detector 132 output. This may be done by simply sweeping over all the values or by using a binary search to find the optimal value. This RF Digital to RF calibration value 148 may then be extrapolated for other NB transmitter 142 output powers. If further channels of the NB transmitter 142 need to be calibrated, then the TX to TX calibration method 500 returns to step 508 and changes the frequency channel and repeats the calibration for the next frequency channel. This repeats until all of the frequency channels have been calibrated. The TX to TX calibration method 500 is typically run when the system starts up. It may also be rerun later as needed if system performance using the initial calibration values starts degrading.

Figure 6:
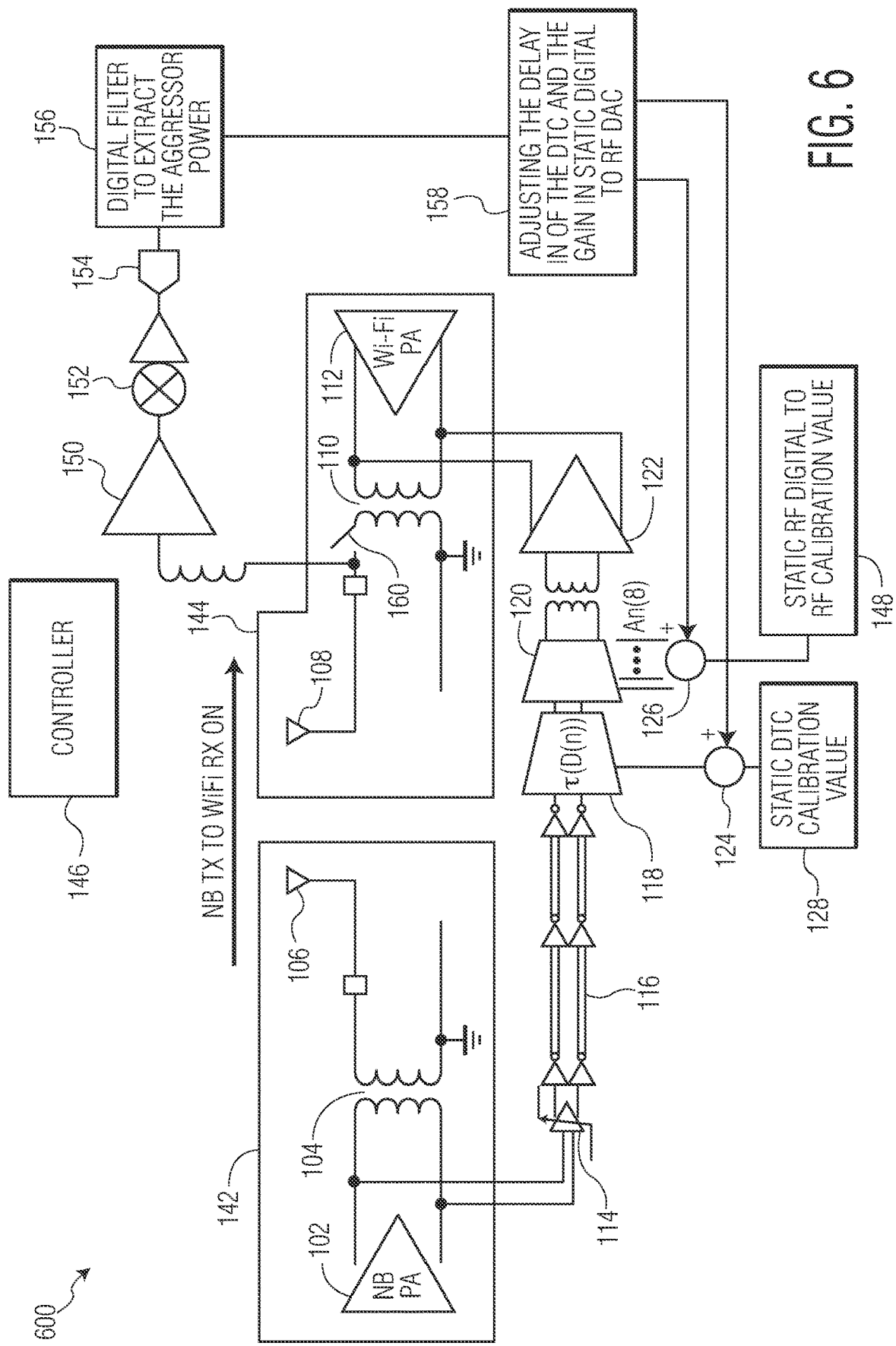
FIG. 6 illustrates an RF system with TX-RX self-interference cancellation.

FIG. 6 illustrates an RF system with TX-RX self-interference cancellation. The RF system 600 is very similar to the RF system 100. The difference with the RF system 600 is that it has elements that provide cancellation for TX-RX receiver interference. Further, here the interference is in the receive path of the system that needs to be cancelled to prevent interference. The elements in FIG. 6 with the same numbers as those of FIG. 1 operate in the same manner and are described above with respect to FIG. 1. The RF system 600 shows the receiver elements of the Wi-Fi transmitter 144. These include a Wi-Fi low noise amplifier (LNA) 150, RX mixer 152, and analog-to-digital converter (ADC) 154. The Wi-Fi LNA 150 amplifies a RF signal received by the Wi-Fi antenna 108. The RX mixer 152 mixes the received RF signal down to baseband and may further filter the mixed signal. This baseband signal is then input into the ADC 154 which samples the received baseband analog signal to produce a digital signal. This digital signal may then be input into a digital filter 156 and the power of the received signal measured. During calibration, the only signal present will be the aggressor signal, so this value may be used in the calibration method described further below. The power value from the digital filter 156 may also be used by the DTC and RF compensator 158 to further compensate the DTC calibration value 128 and RF Digital to RF calibration value 148 values in the same manner as described when the DTC and RF compensator 140 are used to compensate for variations in the antenna coupling during use. The RF system 600 may also include a switch 160 between the Wi-Fi antenna 108 and the receive transformer 110. The switch 160 may be controlled by the controller 146 enable or disable the continuous adjustment of the control values for the DTC 118 and the RF digital to RF converter 120.

Figure 7:
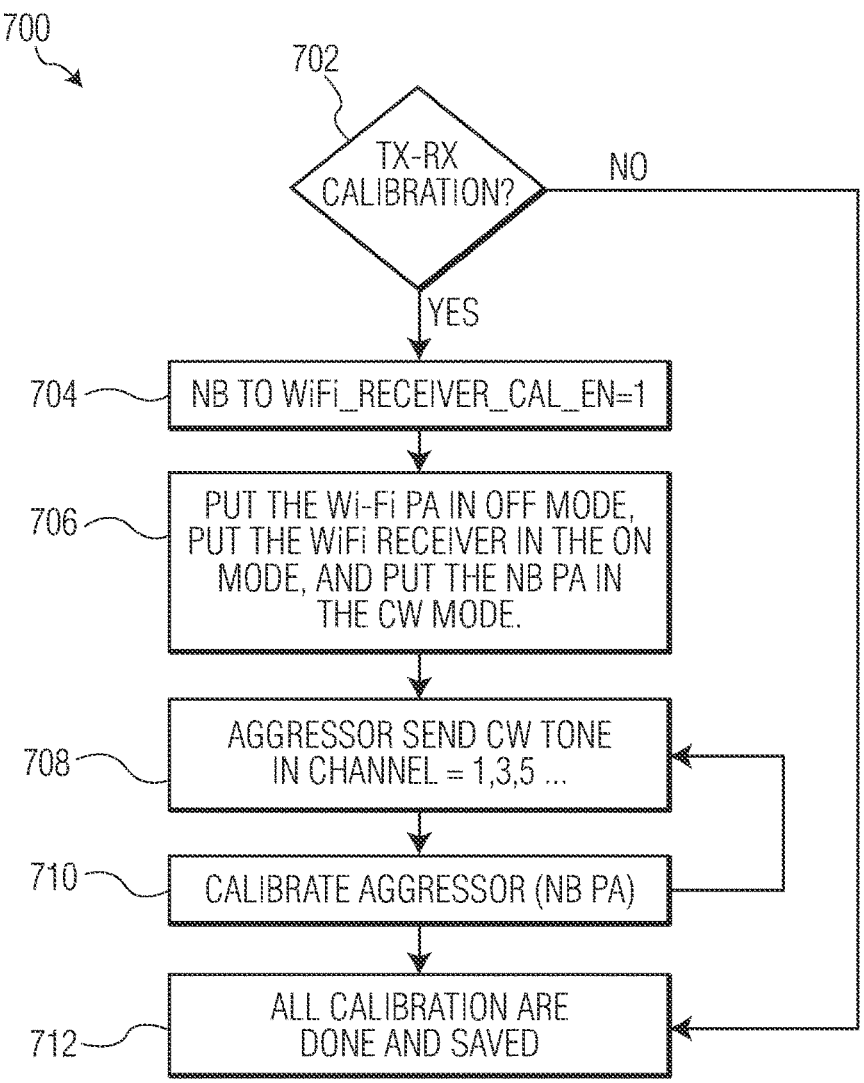
FIG. 7 illustrates a TX to RX calibration method.

FIG. 7 illustrates a TX to RX calibration method 700. The TX to RX calibration method 700 may be used to calibrate the RF system 600 illustrated in FIG. 6 to perform TX-RX cancellation. The TX to RX calibration method 700 may largely be carried out by the controller 146 controlling various elements of the RF system 600. The TX to RX calibration method 700 starts by determining if TX-RX calibration is needed in a TX to RX interference scenario 702. If not, then the TX to RX calibration method 700 goes to step 712 and ends. If so, then the TX to RX calibration method 700 sets an NB to Wi-FI_RECEIVER_CAL_EN flag 704. The TX to RX calibration method 700 then puts the Wi-Fi power amplifier 112 in an off mode, the Wi-Fi receiver in an on mode, and the NB power amplifier 102 in a CW mode 706. Then the TX to RX calibration method 700 has the aggressor, in this case the NB transmitter 142, send out a CW tone at maximum power in a first channel 708. Then the TX to RX calibration method 700 calibrates the RF system 100 based upon the transmitted aggressor tone 510.

The steps of the calibration 710 will now be described. First, the TX to RX calibration method 700 sets a coarse amplitude based on antenna isolation. The antenna may have different potential isolation values controlled by a bit value. For example three different antenna isolation values of −25 dB, −20 dB, and −15 dB may be selected using a three bit input. Second, the TX to RX calibration method 700 determines the optimal phase setting for the DTC 118. This may be done by using a binary search of the delay control values. For example, the binary search may loop over each for the 4 different coarse delay values produced by the coarse delay circuit 202. Then a binary search is performed to determine the fine delay value that produces the lowest output of digital filter 156 for each of the coarse delay values. Once this has been done for each of the four coarse delay values, the fine delay value associated with the lowest digital filter 156 output will be selected as the DTC calibration value 128. The binary search helps to shorten the time it takes to find the fine delay value with the lowest digital filter 156 output. But other methods of searching the control values for the lowest digital filter 156 output may be used as well, including simply cycling through all of the DTC 118 control values. Third, the TX to RX calibration method 700 determines the optimal magnitude value for the RF digital to RF converter 120. This may be done by using the previously determined DTC calibration value 128 and searching the magnitude values for the value that produces the lowest digital filter 156 output. This may be done by simply sweeping over all the values or by using a binary search to find the optimal value. This RF Digital to RF calibration value 148 may then be extrapolated for other NB transmitter 142 output powers. If further channels of the NB transmitter 142 need to be calibrated, then the TX to RX calibration method 700 returns to step 708 and changes the frequency channel and repeats the calibration for the next frequency channel. This repeats until all of the frequency channels have been calibrated. This repeats until all of the frequency channels have been calibrated. The RF system 600 is typically run when the system starts up. It may also be rerun later as needed if system performance using the initial calibration values starts degrading.

It is noted that the embodiments of FIG. 1 and FIG. 6 may be combined so that the RF system may cancel both types of interference.

Figure 8:
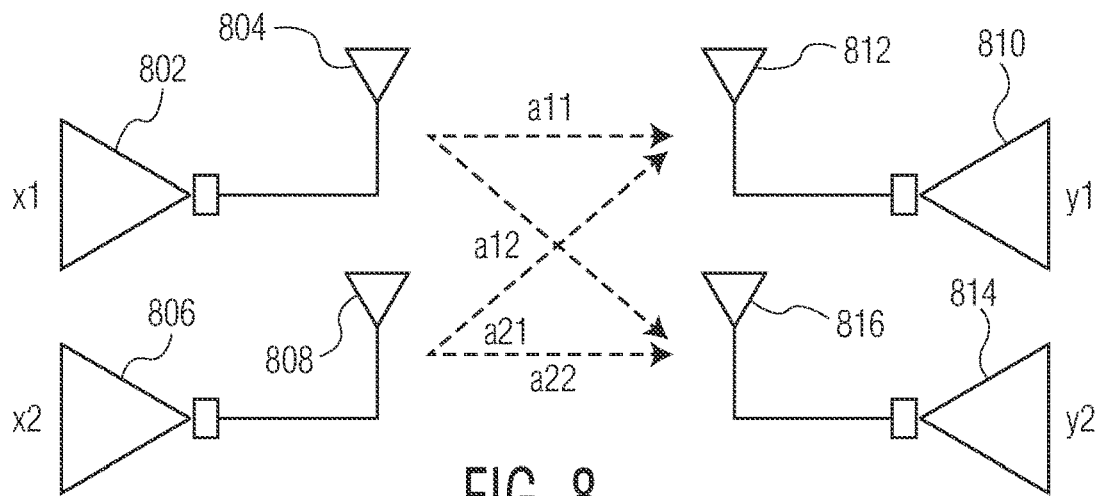
FIG. 8 illustrates a multi-input multi-output (MIMO) system.

FIG. 8 illustrates a multi-input multi-output (MIMO) system. A MIMO system 800 allows for multiple transmitters and receivers to work together. The MIMO system 800 includes a first transmitter 802 connected to a first antenna 804, and a second transmitter 806 connected to a second antenna 808. The first transmitter 802 and first antenna 804 work together to jointly transmit a signal. The use of MIMO allows for beam forming that improves the overall gain available to the transmitters in a particular direction. The MIMO system 800 also includes a third transmitter 810 connected to third antenna 812, and a fourth transmitter 814 connected to fourth antenna 816. Because MIMO may be used for different radios in a single RF system, there are more potential antenna couplings. This is illustrated in FIG. 8 with the mutual coupling values of a11, a12, a21, and a22 illustrated. These cross couplings provide additional opportunities for IMD3 in the various systems. The digital based cancellation approaches described above with respect to FIGS. 1, 5, 6, and 7 may be applied in MIMO systems.

Figure 9:
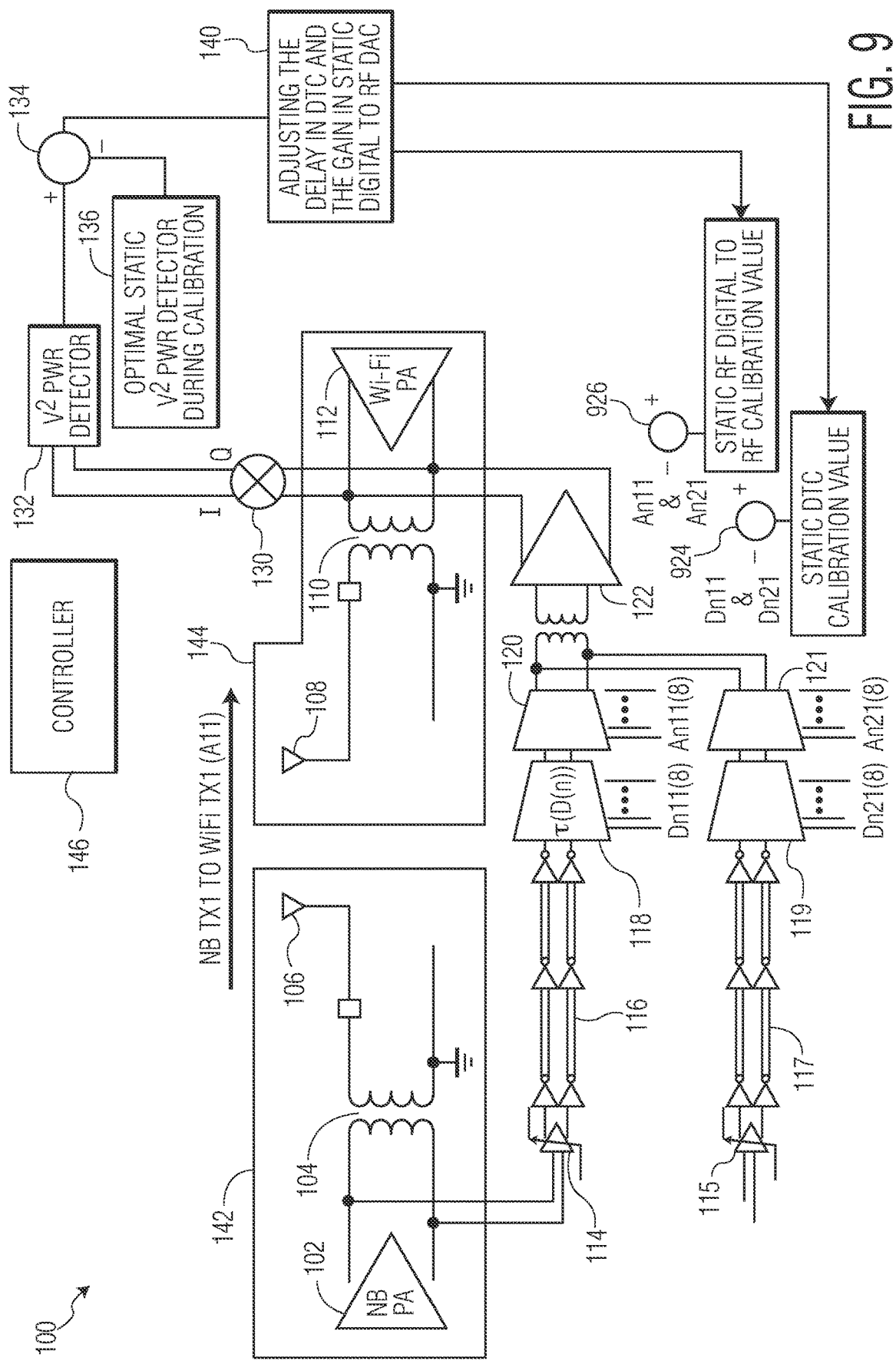
FIG. 9 illustrates a MIMO RF system with an IMD3 cancellation circuit.

FIG. 9 illustrates a MIMO RF system with an IMD3 cancellation circuit. The NB transmitter 942 includes an additional NB power amplifier 103. In such a situation multiple instances of the cancellation elements may be repeated for each cross coupling of antennas. In FIG. 9 the system adds limiter 115, long digital repeater routing 117, DTC 119, and RF digital to RF converter 121 corresponding to NB power amplifier 103. Each of these instances may be calibrated to cancel out the IMD3 interference between selected sets of antennas using amplitude adder 926 and delay adder 924 for each instance of the calibration elements as was done in FIG. 1. While one additional transmitter is show, more than two transmitters may be used. Also, the system may have additional receivers and additional instances of the cancellation elements may be added to further calibrate these additional receivers.

The embodiments disclosed herein provide both TX to TX and TX to RX cancellation using a DTC to provide a delay to match the cancellation signal with the received aggressor signal. The use of a DTC means that no long delay lines are needed to provide the delay. Because the aggressor is a narrow band signal a CW tone may be used as an approximation of the narrow band signal. Further adaptive cancellation may be included that deals with changes in the antenna to antenna channel due to changes in mutual coupling. Further, these embodiments may be expanded to apply to MIMO systems.

The foregoing disclosure provides illustration and description but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, the term "non-transitory machine-readable storage medium" will be understood to exclude a transitory propagation signal but to include all forms of volatile and non-volatile memory. When software is implemented on a processor, the combination of software and processor becomes a specific dedicated machine.

Because the data processing implementing the embodiments described herein is, for the most part, composed of electronic components and circuits known to those skilled in the art, circuit details will not be explained in any greater extent than that considered necessary as illustrated above, for the understanding and appreciation of the underlying concepts of the aspects described herein and in order not to obfuscate or distract from the teachings of the aspects described herein.

Unless stated otherwise, terms such as "first" and "second" are used to arbitrarily distinguish between the elements such terms describe. Thus, these terms are not necessarily intended to indicate temporal or other prioritization of such elements.

It should be appreciated by those skilled in the art that any block diagrams herein represent conceptual views of illustrative hardware embodying the principles of the aspects.

While each of the embodiments are described above in terms of their structural arrangements, it should be appreciated that the aspects also cover the associated methods of using the embodiments described above.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

The invention claimed is:

1. A cancellation circuit, comprising:
   a limiter connected to an output of a first transmitter power amplifier, wherein the limiter is configured to convert in input sinewave to a digital square wave;
   a digital to time converter (DTC) connected to the limiter, wherein the DTC is configured to receive a DTC control value to delay a signal received by the DTC;
   a RF digital to RF converter connected to the DTC, wherein the RF digital to RF converter is configured to convert the digital square wave input into an analog RF output, wherein the RF digital to RF converter is configured to receive a RF Digital to RF control value to control a gain of the RF digital to RF converter;
   a cancellation amplifier with an input configured to receive an output from the RF digital to RF converter and an output connected to an output of a second transmitter power amplifier, wherein the cancellation amplifier produces a cancellation signal to cancel an interference signal at the output of the second transmitter power amplifier from the output of the first transmitter power amplifier; and
   a power detector connected to the output of the second power amplifier, the power detector configured to produce a power value detected at the output of the second power amplifier.

2. The cancellation circuit of claim 1, further comprising a controller configured to calibrate the cancellation circuit.

3. The cancellation circuit of claim 2, wherein calibrating the cancellation circuit further comprises:
   putting the first transmitter power amplifier in an idle mode;
   putting the second transmitter power amplifier in an idle mode;
   commanding the first transmitter power amplifier to produce a continuous wave tone having a frequency of a first frequency channel of the first transmitter power amplifier;
   varying the DTC control value and determining a DTC calibration value that produces lowest power value at the power detector;
   applying the DTC calibration value to the DTC; and
   varying the RF digital to RF control value and determining an RF digital to RF calibration value that produces the lowest power value at the power detector.

4. The cancellation circuit of claim 3, wherein calibrating the cancellation circuit further comprises
   varying the DTC control value and determining a DTC calibration value that produces lowest power value at the power detector includes using a first binary search method, and
   varying the RF digital to RF control value and determining an RF digital to RF calibration value that produces the lowest power value at the power detector includes using a second binary search method.

5. The cancellation circuit of claim 3, further comprising setting a coarse amplitude of the RF digital to RF converter based upon an antenna isolation parameter.

6. The cancellation circuit of claim 3, wherein calibrating the cancellation circuit further comprises:
   repeating for a second to a total number of frequency channels of the first transmit power amplifier to produce DTC calibration values and RF digital to RF calibration values for each of the frequency channels of the first transmit power amplifier:
   selecting one of a second to the total number of frequency channels of the first transmit power amplifier;
   commanding the first transmitter power amplifier to produce a continuous wave tone having the frequency associated with the selected frequency channel;
   varying the DTC control value and determining a DTC calibration value that produces lowest power value at the power detector;
   applying the DTC calibration value to the DTC; and
   varying the RF digital to RF control value and determining an RF digital to RF calibration value that produces the lowest power value at the power detector.

7. The cancellation circuit of claim 1, wherein the controller is configured to:
   monitor the power value at the power detector;
   adjust a DTC calibration value based upon a variation in the power value at the power detector; and
   adjust a RF to digital RF calibration value based upon a variation in the power value at the power detector.

8. The cancellation circuit of claim 1, wherein the cancellation amplifier is a scaled version of the second transmitter power amplifier.

9. The cancellation circuit of claim 1, a transmit signal produced by the first transmitter power amplifier is a constant envelope signal.

10. A cancellation circuit, comprising:
    a limiter connected to an output of a first transmitter power amplifier, wherein the limiter is configured to convert in input sinewave to a digital square wave;
    a digital to time converter (DTC) connected to the limiter, wherein the DTC is configured to receive a DTC control value to delay a signal received by the DTC;
    a RF digital to RF converter connected to the DTC, wherein the RF digital to RF converter is configured to convert the digital square wave input into an analog output, wherein the RF digital to RF converter is configured to receive a RF Digital to RF control value to control a gain of the RF digital to RF converter;

a cancellation amplifier with an input configured to receive an output from the RF digital to RF converter and an output connected to an output of a second transmitter power amplifier, wherein the cancellation amplifier produces a cancellation signal to cancel an interference signal at the output of the second transmitter power amplifier from the output of the first transmitter power amplifier;

a receiver including:

a low noise amplifier (LNA) attached to a first side of a transformer, wherein the transformer has a second side connected to the output of the second power amplifier;

a baseband mixer connected to the LNA; and an analog-to-digital converter (ADC) connected to the baseband mixer; and a digital filter connected to the output of ADC, the digital filter configured to produce a power value detected at the first side of the transformer.

11. The cancellation circuit of claim 10, further comprising a controller configured to calibrate the cancellation circuit.

12. The cancellation circuit of claim 11, wherein calibrating the cancellation circuit further comprises:

putting the first transmitter power amplifier in a continuous wave (CW) mode;

putting the second transmitter power amplifier in an off mode;

putting the receiver in an on mode;

commanding the first transmitter power amplifier to produce a continuous wave tone having a frequency of a first frequency channel of the first transmitter power amplifier;

varying the DTC control value and determining a DTC calibration value that produces lowest power value at the digital filter;

applying the DTC calibration value to the DTC; and varying the RF digital to RF control value and determining an RF digital to RF calibration value that produces the lowest power value at the digital filter.

13. The cancellation circuit of claim 12, wherein calibrating the cancellation circuit further comprises varying the DTC control value and determining a DTC calibration value that produces lowest power value at the digital filter includes using a first binary search method, and varying the RF digital to RF control value and determining an RF digital to RF calibration value that produces the lowest power value at the digital filter includes using a second binary search method.

14. The cancellation circuit of claim 12, further comprising setting a coarse amplitude of the RF digital to RF converter based upon an antenna isolation parameter.

15. The cancellation circuit of claim 12, wherein calibrating the cancellation circuit further comprises:

repeating for a second to a total number of frequency channels of the first transmit power amplifier to produce DTC calibration values and RF digital to RF calibration values for each of the frequency channels of the first transmit power amplifier:

selecting one of a second to the total number of frequency channels of the first transmit power amplifier;

commanding the first transmitter power amplifier to produce a continuous wave tone having the frequency associated with the selected frequency channel;

varying the DTC control value and determining a DTC calibration value that produces lowest power value at the digital filter;

applying the DTC calibration value to the DTC; and varying the RF digital to RF control value and determining an RF digital to RF calibration value that produces the lowest power value at the digital filter.

16. The cancellation circuit of claim 10, wherein the controller is configured to:

monitor the power value at the digital filter;

adjust DTC calibration value based upon a variation in the power value at the digital filter; and adjust a RF to digital RF calibration value based upon a variation in the power value at the digital filter.

17. The cancellation circuit of claim 10, wherein the cancellation amplifier is a scaled version of the second transmitter power amplifier.

18. The cancellation circuit of claim 10, a transmit signal produced by the first transmitter power amplifier is a constant envelope signal.

19. A cancellation circuit for a multiple-input multiple-output system, comprising:

a first limiter connected to an output of a first transmitter power amplifier, wherein the limiter is configured to convert in input sinewave to a digital square wave;

a first digital to time converter (DTC) connected to the limiter, wherein the first DTC is configured to receive a first DTC control value to delay a signal received by the first DTC;

a first RF digital to RF converter connected to the DTC, wherein the first RF digital to RF converter is configured to convert the digital square wave input into an analog output, wherein the first RF digital to RF converter is configured to receive a first RF Digital to RF control value to control a gain of the first RF digital to RF converter;

a second limiter connected to an output of a second transmitter power amplifier;

a second digital to time converter (DTC) connected to the limiter, wherein the second DTC is configured to receive a second DTC control value to delay a signal received by the second DTC;

a second RF digital to RF converter connected to the DTC, wherein the second RF digital to RF converter is configured to convert the digital square wave input into an analog output, wherein the second RF digital to RF converter is configured to receive a second RF Digital to RF control value to control a gain of the second RF digital to RF converter;

a cancellation amplifier with an input configured to receive an output from the first RF digital to RF converter and the second RF digital to RF converter and an output connected to an output of a third transmitter power amplifier, wherein the cancellation amplifier is configured to produce a cancellation signal to cancel an interference signal at the output of the third transmitter power amplifier from the output of the first transmitter power amplifier and the output of the second transmitter power amplifier; and a power detector connected to the output of the third power amplifier, the power detector configured to produce a power value detected at the output of the third power amplifier.

20. The cancellation circuit of claim 19, further comprising a controller configured to calibrate the cancellation circuit.

\* \* \* \* \*